(12) United States Patent
Heavens et al.

(10) Patent No.: US 6,433,710 B1
(45) Date of Patent: Aug. 13, 2002

(54) DATA COMPRESSION AND MULTIPLE PARAMETER ESTIMATION

(75) Inventors: Alan F. Heavens, Roslin (GB); Raul Jimenez, Princeton, NJ (US); Ofer Lahav, Cambridge (GB)

(73) Assignee: The University Court of the University of Edinburgh (GB)

(*) Notice: Subject to any disclaimer, the term of this patent is extended or adjusted under 35 U.S.C. 154(b) by 0 days.

(21) Appl. No.: 09/706,348

(22) Filed: Nov. 3, 2000

(51) Int. Cl.[7] .............................................. H03M 7/00
(52) U.S. Cl. ............................ 341/107; 704/240; 707/6
(58) Field of Search ........................... 341/107; 704/240

(56) References Cited

U.S. PATENT DOCUMENTS

| | | | |
|---|---|---|---|
| 6,115,708 A | * 9/2000 | Fayyad et al. | 707/6 |
| 6,219,142 B1 | * 4/2001 | Kane | 356/450 |
| 6,269,334 B1 | * 7/2001 | Basu et al. | 704/256 |
| 6,330,353 B1 | * 12/2001 | Lai et al. | 382/147 |

OTHER PUBLICATIONS

Tegmark M., Taylor A., Heavens A., Karhunen–Loéve Eigenvalue Problems in Cosmology: How Should We Tackle Large Data Sets?; Astrophysical Journal, 480:22–35, May 1, 1997.

Tegmark M., How to Make Maps From Cosmic Microwave Background Data Without Losing Information; Astrophysical Journal, 480:L87–L90, May 10, 1997.

Tegmark M., How to Measure CMB Power Spectra Without Losing Information; 1997b Physical Review D, 55, 5895.

* cited by examiner

Primary Examiner—Brian Young
Assistant Examiner—John Nguyen
(74) Attorney, Agent, or Firm—Dann, Dorfman, Herrell and Skillman, P.C.

(57) ABSTRACT

A method for radical linear compression of datasets where the data are dependent on some number M of parameters. If the noise in the data is independent of the parameters, M linear combinations of the data can be formed, which contain as much information about all the parameters as the entire dataset, in the sense that the Fisher information matrices are identical; i.e. the method is lossless. When the noise is dependent on the parameters, the method, although not precisely lossless, increases errors by a very modest factor. The method is general, but is illustrated with a problem for which it is well-suited: galaxy spectra, whose data typically consist of about 1000 fluxes, and whose properties are set by a handful of parameters such as age, brightness and a parameterized star formation history. The spectra are reduced to a small number of data, which are connected to the physical processes entering the problem. This data compression offers the possibility of a large increase in the speed of determining physical parameters. This is an important consideration as datasets of galaxy spectra reach $10^6$ in size, and the complexity of model spectra increases. In addition to this practical advantage, the compressed data may offer a classification scheme for galaxy spectra which is based rather directly on physical processes.

7 Claims, 5 Drawing Sheets

DATA COMPRESSION AND MULTIPLE PARAMETER ESTIMATION

BACKGROUND TO THE INVENTION

This invention relates to a method of data compression for the estimation of a plurality of parameters on which a dataset is dependent.

There are many instances where objects consist of many data, whose values are determined by a small number of parameters. Often, it is only these parameters which are of interest. An aim of this invention is to find linear combinations of the data which are focussed on estimating the physical parameters with as small an error as possible.

Such a problem is very general, and has been attacked in the case of parameter estimation in large-scale structure and the microwave background (e.g. Tegmark M., Taylor A., Heavens A., 1997 Astrophysical Journal 480, 22. [hereafter TTH], Tegmark M., 1997a. Astrophysical Journal (Letters) 480, L87 and Tegmark M., 1997b Physical Review D, 55, 5895.) The entire disclosure of these three documents is incorporated herein by way of reference. Previous work has concentrated largely on the estimation of a single parameter; the main advance of this invention is that it provides a method for the estimation of multiple parameters. The method provides one projection per parameter, with the consequent possibility of a massive data compression factor. Furthermore, if the noise in the data is independent of the parameters, then the method is entirely lossless. i.e. the compressed dataset contains as much information about the parameters as the full dataset, in the sense that the Fisher information matrix is the same for the compressed dataset as the entire original dataset. An equivalent statement is that the mean likelihood surface is at the peak locally identical when the full or compressed data are used.

The method will be illustrated herein with the case of galaxy spectra, for which there are surveys underway which will provide ~$10^6$ objects. In this application, the noise is generally not independent of the parameters, as there is a photon shot-noise component which depends on how many photons are expected. We take a spectrum with poor signal-to-noise, whose noise is approximately from photon counting alone, and investigate how the method fares. In this case, the method is not lossless, but the increase in error bars is shown to be minimal, and superior in this respect to an alternative compression system PCA (Principal Component Analysis).

One advantage such radical compression offers is speed of analysis. One major scientific goal of galaxy spectral surveys is to determine physical parameters of the stellar component of the galaxies, such as the age, star formation history, initial mass function and so on. Such a process can, in principle, be achieved by generating model galaxy spectra by stellar population synthesis techniques, and finding the best-fitting model by maximum-likelihood techniques. This can be very time-consuming, and must inevitably be automated for so many galaxies. In addition, one may have a large parameter space to explore, so any method which can speed up this process is worth investigation. One possible further application of the data compression method is that the handful of numbers might provide the basis of a classification scheme which is based on the physical properties one wants to measure.

SUMMARY OF THE INVENTION

The present invention provides a method of compressing a dataset which is dependent on a plurality of parameters, as well as on noise, comprising forming a plurality of sets of weights, one set for each parameter, from an initial guess for the parameters, multiplying all the data in the dataset by each set of weights in turn turn and summing the products in each case to give compressed data for estimating the parameters, the number of compressed data being equal to the number of parameters.

In an embodiment of the invention, the dataset is represented by a vector $x_i$, i=1, ... N (e.g. a set of fluxes at different wavelengths). These measurements include a signal part, which we denote by $\mu$, and noise, n:

$$x = \mu + n \tag{1}$$

Assuming the noise has zero mean, $<x>=\mu$. The signal will depend on a set of parameters $\{\theta_\alpha\}$, which we wish to determine. For galaxy spectra, the parameters may be, for example, age, magnitude of source, metallicity and some parameters describing the star formation history. Thus, $\mu$ is a noise-free spectrum of a galaxy with certain age, metallicity etc.

The noise properties are described by the noise covariance matrix, C, with components $C_{ij}=<n_i n_j>$. If the noise is gaussian, the statistical properties of the data are determined entirely by $\mu$ and C. In principle, the noise can also depend on the parameters. For example, in galaxy spectra, one component of the noise will come from photon counting statistics, and the contribution of this to the noise will depend on the mean number of photons expected from the source.

The aim is to derive the parameters from the data. If we assume uniform priors for the parameters, then the a posteriori probability for the parameters is the likelihood, which for gaussian noise is $$\mathcal{L}(\theta_\alpha) = \frac{1}{(2\pi)^{N/2}\sqrt{\det(C)}} \times \exp\left[-\frac{1}{2}\sum_{i,j}(x_i - \mu_i)C_{ij}^{-1}(x_j - \mu_j)\right]. \tag{2}$$

One approach is simply to find the (highest) peak in the likelihood, by exploring all parameter space, and using all N pixels. The position of the peak gives estimates of the parameters which are asymptotically (low noise) the best unbiased estimators (see TTH). This is therefore the best we can do. The maximum-likelihood procedure can, however, be time-consuming if N is large, and the parameter space is large. An aim of this invention is to reduce the N values to a smaller number, without increasing the uncertainties on the derived parameters $\theta_\alpha$. To be specific, we try to find a number N'<N of linear combinations of the spectral data x which encompass as much as possible of the information about the physical parameters. We have found that this can be done lossless in some circumstances; the spectra can be reduced to a handful of numbers without loss of information. The speed-up in parameter estimation is by a factor ~100.

In general, reducing the dataset in this way will lead to larger error bars in the parameters. To assess how well the compression is doing, consider the behavior of the (logarithm of the) likelihood function near the peak. Performing a Taylor expansion and truncating at the second-order terms, $$\ln \mathcal{L} = \ln \mathcal{L}_{peak} + \frac{1}{2} \frac{\partial^2 \ln \mathcal{L}}{\partial \theta_\alpha \partial \theta_\beta} \Delta \theta_\alpha \Delta \theta_\beta. \tag{3}$$

Truncating here assumes that the likelihood surface itself is adequately approximated by a gaussian everywhere, not just at the maximum-likelihood point. The actual likelihood surface will vary when different data are used; on average, though, the width is set by the (inverse of the) Fisher information matrix:

$$F_{\alpha\beta} \equiv -\left\langle \frac{\partial^2 \ln \mathcal{L}}{\partial \theta_\alpha \partial \theta_\beta} \right\rangle \tag{4}$$

where the average is over an ensemble with the same parameters but different noise.

For a single parameter, the Fisher matrix F is a scalar F, and the error on the parameter can be no smaller than $F^{1/2}$. If the data depend on more than one parameter, and all the parameters have to be estimated from the data, then the error is larger. The error on one parameter a (marginalized over the others) is at least $[(F^{-1})_{\alpha\alpha}]^{-1/2}$ see Kendall M. G., Stuart A., 1969 *The Advanced Theory of Statistics*, London: Griffin. There is a little more discussion of the Fisher matrix in TTH. The Fisher matrix depends on the signal and noise terms in the following way (TTH, equation 15)

$$F_{\alpha\beta} = \frac{1}{2} Tr[C^{-1} C_{,\alpha} C^{-1} C_{,\beta} + C^{-1}(\mu_{,\alpha} \mu_{,\beta}^t + \mu_{,\beta} \mu_{,\alpha}^t)]. \tag{5}$$

where the comma indicates derivative with respect to the parameter. If we use the full dataset x, then this Fisher matrix represents the best that can possibly be done via likelihood methods with the data.

In practice, some of the data may tell us very little about the parameters, either through being very noisy, or through having little or no sensitivity to the parameters. So in principle we may be able to throw some data away without losing very much information about the parameters. Rather than throwing individual data away, we can do better by forming linear combinations of the data, and then throwing away the combinations which tell us least. To proceed, we first consider a single linear combination of the data:

$$y = b^t x \tag{6}$$

for some weighting vector b (t indicates transpose). We will try to find a weighting which captures as much information about a particular parameter, $\theta_\alpha$. If we assume we know all the other parameters, this amounts to maximizing $F_{\alpha\alpha}$. The dataset (now consisting of a single number) has a Fisher matrix, which is given in TTH (equation 25) by:

$$F_{\alpha\beta} = \frac{1}{2} \left( \frac{b^t C_{,\alpha} b}{b^t C b} \right) \left( \frac{b^t C_{,\beta} b}{b^t C b} \right) + \frac{(b^t \mu_{,\alpha})(b^t \mu_{,\beta})}{(b^t C b)}. \tag{7}$$

Note that the denominators are simply numbers. It is clear from this expression that if we multiply b by a constant, we get the same F. This makes sense: multiplying the data by a constant factor does not change the information content. We can therefore fix the normalization of b at our convenience. To simplify the denominators, we therefore maximize $F_{\alpha\alpha}$ subject to the constraint $$B^t C b = 1 \tag{8}$$

The most general problem has both the mean $\mu$ and the covariance matrix C depending on the parameters of the spectrum, and the resulting maximization leads to an eigenvalue problem which is nonlinear in b. We are unable to solve this, so we consider a case for which an analytic solution can be found. TTH showed how to solve for the case of estimation of a single parameter in two special cases: 1) when $\mu$ is known, and 2) when C is known (i.e. does not depend on the parameters). We will concentrate on the latter case, but generalize to the problem of estimating many parameters at once. For a single parameter, TTH showed that the entire dataset could be reduced to a single number, with no loss of information about the parameter. We show below that, if we have M parameters to estimate, then we can reduce the dataset to M numbers. These M numbers contain just as much information as the original dataset; i.e. the data compression is lossless.

We consider the parameters in turn. With C independent of the parameters, F simplifies, and, maximizing $F_{11}$ subject to the constraint requires $$\frac{\partial}{\partial b_i} (b_j \mu_{,1j} b_k \mu_{,1k} - \lambda b_j C_{jk} b_k) = 0 \tag{9}$$

where $\lambda$ is a Lagrange multiplier, and we assume the summation convention (j, k $\in$ [1, N]). This leads to $$\mu_{,1}(b^t \mu_{,1}) = \lambda C b \tag{10}$$

with solution, properly normalized $$b_1 = \frac{C^{-1} \mu_{,1}}{\sqrt{\mu_{,1}^t C^{-1} \mu_{,1}}} \tag{11}$$

and our compressed datum is the single number $y_1 = b_1^t x$. This solution makes sense—ignoring the unimportant denominator, the method weights high those data which are parameter-sensitive, and low those data which are noisy.

To see whether the compression is lossless, we compare the Fisher matrix element before and after the compression. Substitution of $b_1$ into (7) gives $$F_{11} = \mu_{,1}^t C^{-1} \mu_{,1} \tag{12}$$

which is identical to the Fisher matrix element using the full data (equation 5) if C is independent of $\theta_1$. Hence, as claimed by TTH, the compression from the entire dataset to the single number $y_1$ loses no information about $\theta_1$. For example, if $\mu \theta$, then $y_1 = \Sigma_i x_i / \Sigma_i \mu_i$ is simply an estimate of the parameter itself Fiducial Model It is important to note that $y_i$ contains as much information about $\theta_1$ only if all other parameters are known, and also provided that the covariance matrix and the derivative of the mean in (11) are those at the maximum likelihood point. We turn to the first of these restrictions in the next section, and discuss the second one here.

In practice, one does not know beforehand what the true solution is, so one has to make an initial guess for the parameters. This guess we refer to as the fiducial model. We compute the covariance matrix C and the gradient of the mean ($\mu_{,\alpha}$) for this fiducial model, to construct $b_1$. The Fisher matrix for the compressed datum is (12), but with the fiducial values inserted. In general this is not the same as Fisher matrix at the true solution. In practice one can iterate: choose a fiducial model; use it to estimate the parameters, and then repeat, using the estimated parameters as the new fiducial model. As our example in section 4 shows, such iteration may be completely unnecessary.

Estimation of Many Parameters

The problem of estimating a single parameter from a set of data is unusual in practice. Normally one has several parameters to estimate simultaneously, and this introduces substantial complications into the analysis. The invention generalises the single-parameter estimate above to the case of many parameters. We proceed by finding a second number $y_2 \equiv b'_2 x$ by the following requirements:

$y_2$ is uncorrelated with $y_1$. This demands that $b'_2 C b_1 = 0$.

$y_2$ captures as much information as possible about the second parameter $\theta_2$.

This requires two Lagrange multipliers (we normalize $b_2$ by demanding that $b'_2 C b_1 = 1$ as before). Maximizing and applying the constraints gives the solution $$b_2 = \frac{C^{-1}\mu_{,2} - (\mu'_{,2}b_1)b_1}{\sqrt{\mu_{,2}C^{-1}\mu_{,2} - (\mu'_{,2}b_1)^2}}. \tag{13}$$

This is readily generalized to any number M of parameters. There are then M orthogonal vectors $b_m$, m=1, . . . M, each $y_m$ capturing as much information about parameter $\alpha_m$ which is not already contained in $y_q$; q<m. The constrained maximization gives $$b_m = \frac{C^{-1}\mu_{,m} - \sum_{q=1}^{m-1}(\mu'_{,m}b_q)b_q}{\sqrt{\mu_{,m}C^{-1}\mu_{,m} - \sum_{q=1}^{m-1}(\mu'_{,m}b_q)^2}}. \tag{14}$$

This procedure is analogous to Gram-Schmidt orthogonalization with a curved metric, with C playing the role of the metric tensor. Note that the procedure gives precisely M eigenvectors and hence M numbers, so the dataset has been compressed from the original N data down to the number of parameters M.

Since, by construction, the numbers $y_m$ are uncorrelated, the likelihood of the parameters is obtained by multiplication of the likelihoods obtained from each statistic $y_m$. The $y_m$ have mean $<y_m> = b'_m \mu$ and unit variance, so the likelihood from the compressed data is simply $$\ln \mathcal{L}(\theta_\alpha) = \text{constant} - \sum_{m=1}^{M} \frac{(y_m - \langle y_m \rangle)^2}{2} \tag{15}$$

and the Fisher matrix of the combined numbers is just the sum of the individual Fisher matrices. Note once again the role of the fiducial model in setting the weightings $b_m$: the orthonormality of the new numbers only holds if the fiducial model is correct. Multiplication of the likelihoods is thus only approximately correct, but iteration could be used if desired.

Proof that the Method can be Lossless for Many Parameters

Under the assumption that the covariance matrix is independent of the parameters, reduction of the original data to the M numbers $y_m$ results in no loss of information about the M parameters at all. In fact the set $\{y_m\}$ produces, on average, a likelihood surface which is locally identical to that from the entire dataset—no information about the parameters is lost in the compression process. With the restriction that the information is defined locally by the Fisher matrix, the set $\{y_m\}$ is a set of sufficient statistics for the parameters $\{\theta_\alpha\}$ (e.g. Koch K., 1999. *Parameter Estimation and Hypothesis Testing in Linear Models*, Springer-Verlag (Berlin). A proof of this for an arbitrary number of parameters is given in the appendix.

The General Case

In general, the covariance matrix does depend on the parameters, and this is the case for galaxy spectra, where at least one component of the noise is parameter-dependent. This is the photon counting noise, for which $C_{ii} = \mu_i$. TTH argued that it is better to treat this case by using the n eigenvectors which arise from assuming the mean is known, rather than the single number (for one parameter) which arises if we assume that the covariance matrix is known, as above. We have found that, on the contrary, the small number of eigenvectors $b_m$ allow a much greater degree of compression than the known-mean eigenvectors (which in this case are simply individual pixels, ordered by $\mu_{,\alpha}/\mu$). For data signal-to-noise of around 2, the latter allow a data compression by about a factor of 2 before the errors on the parameters increase substantially, whereas the method of the invention allows drastic compression from thousands of numbers to a handful. To show what can be achieved, we use a set of simulated galaxy spectra to constrain a few parameters characterizing the galaxy star formation history.

Parameter Eigenvectors

In the case when the covariance matrix is independent of the parameters, it does not matter which parameter we choose to form $y_1$, $y_2$ etc, as the likelihood surface from the compressed numbers is, on average, locally identical to that from the full dataset. However, in the general case, the procedure does lose information, and the amount of information lost could depend on the order of assignment of parameters to m. If the parameter estimates are correlated, the error in both parameters is dominated by the length of the likelihood contours along a 'ridge'. It makes sense then to diagonalize the matrix of second derivatives of ln L at the fiducial model, and use these as the parameters (temporarily), for galaxy surveys. The parameter eigenvalues would order the importance of the parameter combinations to the likelihood. The procedure would be to take the smallest eigenvalue (with eigenvector lying along the ridge), and make the likelihood surface as narrow as possible in that direction. One then repeats along the parameter eigenvectors in increasing order of eigenvalue.

Specifically, diagonalize $F_{\alpha\beta}$ in (5), to form a diagonal covariance matrix $\Lambda = S'FS$. The orthogonal parameter combinations are $\psi = S'\theta$, where S has the normalized eigenvectors of F as its columns. The weighting vectors $b_m$ are then computed from (14) by replacing $\mu_{,\alpha p}$ with $S_{pr}\mu_{,\alpha r}$.

The parameters may be ordered in an arbitrary way or replaced by new parameters which are dependent combinations of the original parameters.

Other objects, advantages and features of the present invention will become more readily appreciated and understood when taken together with the following detailed description of an example of the use of the invention in connection with galaxy spectra, in connection with the accompanying drawings, in which:

DETAILED DESCRIPTION OF THE PREFERRED EMBODIMENTS

Figure 1:
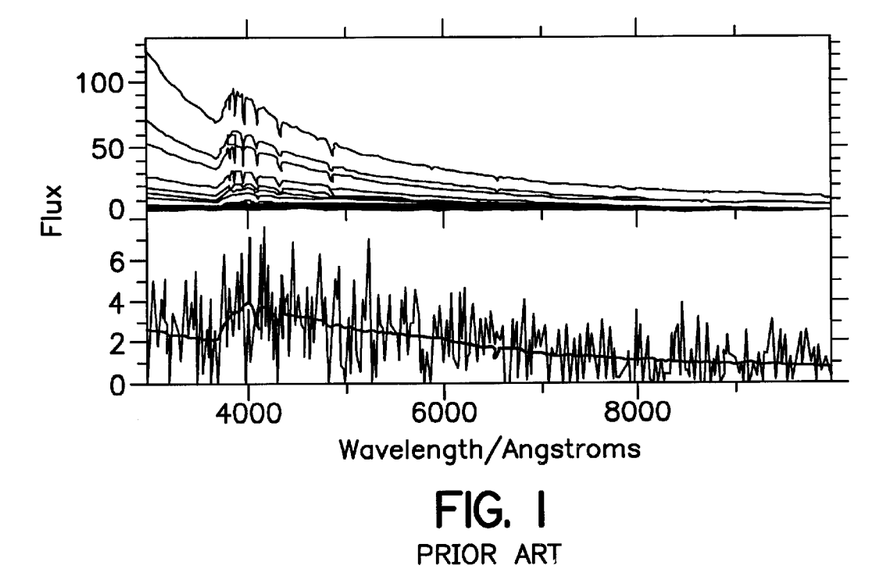
FIG. 1 shows simulated galaxy spectra forming a dataset on which the invention can be used.

We start by investigating a two-parameter model. We have run a grid of stellar evolution models, with a burst of star formation at time $-t$, where $t=0$ is the present day. The star formation rate is $SFR(t')=A\delta(t'+t)$ where $\delta$ is a Dirac delta function. The two parameters to determine are age $t$ and normalization $A$. FIG. 1 shows some spectra with fixed normalization (1 M of stars produced) and different age. There are $n=352$ pixels between 300 and 1000 nm. Real data will be more complicated (variable transmission, instrumental noise etc) but this system is sufficiently complex to test the methods in essential respects. For simplicity, we assume that the noise is gaussian, with a variance given by the mean, $C=\text{diag}(\mu_1 \ldots)$ This is appropriate for photon number counts when the number is large. We assume the same behavior, even with small numbers, for illustration, but there is no reason why a more complicated noise model cannot be treated. It should be stressed that this is a more severe test of the model than a typical galaxy spectrum, where the noise is likely to be dominated by sources independent of the galaxy, such as CCD read-out noise or sky background counts. In the latter case, the compression method will do even better than the example here.

In FIG. 1, the top panel shows example model spectra, with age increasing downwards. The bottom panel shows a simulated galaxy spectrum (including noise), whose properties we wish to determine, superimposed on a noise-free spectrum of galaxy with the same age.

The simulated galaxy spectrum is one of the galaxy spectra (age 3.95 Gyr, model number 100), and the maximum signal-to-noise per bin is taken to be 2. The noise is approximately photon noise, with a gaussian distribution with variance equal to the number of photons in each channel. Hence $C=\text{diag}(\mu_1, \mu_2, \ldots)$.

Figure 2:
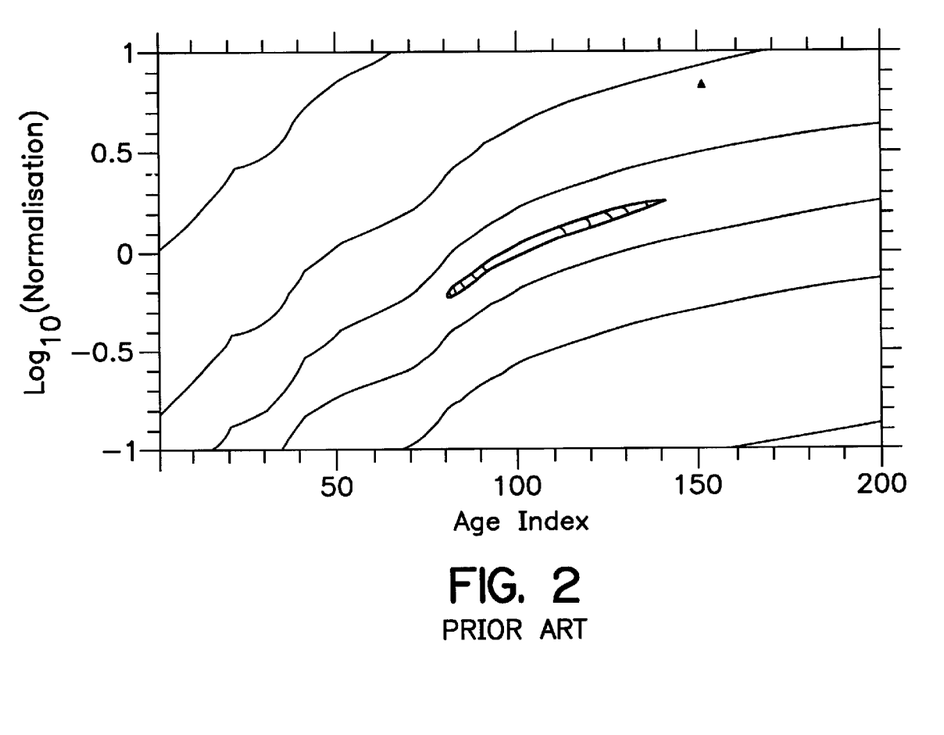
FIG. 2 is a contour plot providing a full likelihood solution for age and normalization for the dataset of FIG. 1, obtained by the known method of using all pixels.

The most probable values for the age and normalization (assuming uniform priors) is given by maximizing the likelihood:

$$\mathcal{L}(\text{age, norm}) = \frac{1}{(2\pi)^{n/2}\sqrt{\Pi_i \mu_i}} \times \exp\left[-\frac{1}{2}\sum_i (x_i - \mu_i)^2/\mu_i\right] \quad (16)$$

where $\mu$ depends on age and normalization. ln L is shown in FIG. 2, a full likelihood solution using all pixels. There are 6 contours running down from the peak value in steps of 0.5 (in ln L), and 3 outer contours at $-100$, $-1000$ and $-10000$. The triangle in the upper-right corner marks the fiducial model which determines the eigenvectors $b_{1,3}$. Since this uses all the data, and all the approximations hold, this is the best that can be done, given the S/N of the spectrum.

Figure 3:
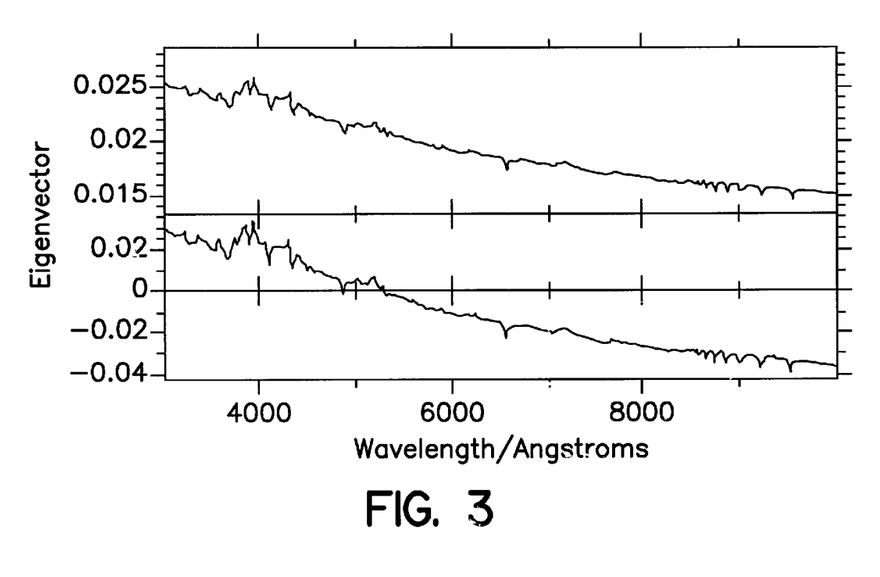
FIG. 3 is a graph of eigenvectors for the age and normalization against wavelength.

FIG. 3 shows the eigenvectors $-b_1$ (age) and $-b_2$ (normalization). The wavelength $\lambda$ is in Angstroms. Note that the weights in $b_1$ are negative, which is why the sign has been changed for plotting: the blue (left) end of the spectrum which is weighted most heavily for $y_1$. This is expected as this part of the spectrum changes most rapidly with age. Note that these weightings differ by a constant; this feature is special to the amplitude parameter.

Figure 4:
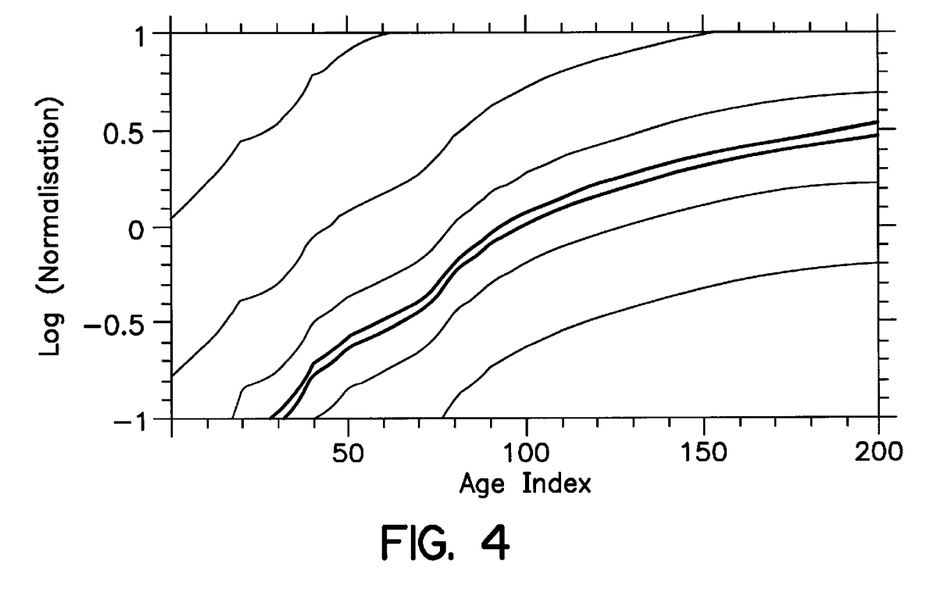
FIG. 4 is a contour plot of a likelihood solution for the age datum $y_1$.
Figure 5:
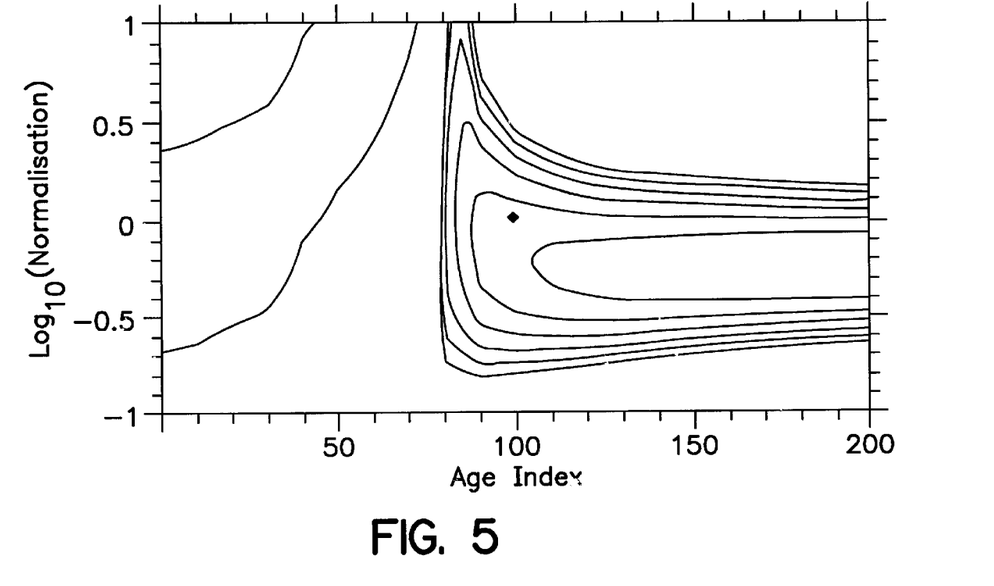
FIG. 5 is a contour plot of a likelihood solution for the normalization datum $y_2$.
Figure 6:
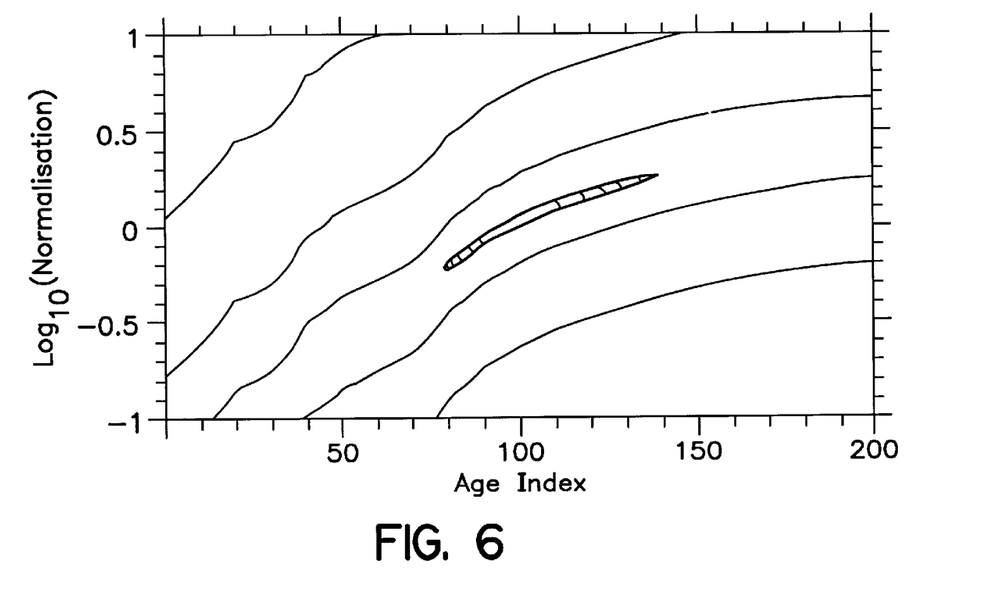
FIG. 6 is a contour plot as in FIG. 2, but obtained using an embodiment of the invention.

To solve the eigenvalue problem for b requires an initial guess for the spectrum. This 'fiducial model' was chosen to have an age of 8.98 Gyr, i.e. very different from the true solution (model number 150 rather than 100). This allows us to compute the eigenvector $b_1$ from (11). This gives the single number $y_1 = b^t_1 x$. With this as the datum, the likelihood for age and normalization is $$\mathcal{L}(\text{age, norm}) = \frac{1}{\sqrt{2\pi}} \exp\left[-\frac{(y_1 - \langle y_1 \rangle)^2}{2}\right] \quad (17)$$

where $\langle y_1 \rangle = b^t_1 \mu$. Note that the mean and covariance matrix here depend on the parameters—i.e. they are not from the fiducial model. The resultant likelihood is shown in FIG. 4, in which the values of the contours are as in FIG. 2. Clearly it does less well than the full solution of FIG. 2, but it does constrain the parameters to a narrow ridge, on which the true solution (age model=100, log (normalization)=0 lies. The second eigenvector $b_2$ is obtained by taking the normalization as the second parameter. The vector is shown in the lower panel of FIG. 3. The normalization parameter is rather a special case, which results in $b_2$ differing from $b_1$ only by a constant offset in the weights (for this parameter $\mu_{,\alpha} = \mu$ and so $C^{-1}\mu_{,\alpha} = (1, 1, \ldots 1)^t$). The likelihood for the parameters with $y_2$ as the single datum is shown in FIG. 5. On its own, it does not tightly constrain the parameters, but when combined with $y_1$, it does remarkably well (FIG. 6).

Three-Parameter Estimation

We complicate the situation now to a 3-parameter star-formation rate $SFR(t)=A\exp(-t/\tau)$, and estimate A, t and τ. Chemical evolution is included by using a simple closed-box model (with instantaneous recycling; Pagel B., 1997. *Nucleosynthesis and Chemical Estimation of Galaxies,* Cambridge University Press, Cambridge). This affects the depths of the absorption lines. If we follow the same procedure as before, choosing (t, A, τ) as the order for computing $b_1$, $b_2$ and $b_3$, then the product of the likelihoods from $y_1$, $y_2$ and $y_3$ can be found. The likelihood from the full dataset of 1000 numbers does little better than the 3 compressed numbers. It is interesting to explore how the parameter eigenvector method fares in this case. Here we maximize the curvature along the ridge first. The resulting three numbers constrain the parameters; in this case there is no apparent improvement over using eigenvectors from (t, A, τ), but it may be advantageous in other applications.

Estimate of Increase in Errors

For the noise model we have adopted, we can readily compute the increase in the conditional error for one of the parameters—the normalization of the spectrum. This serves as an illustration of how much information is lost in the compression process. In this case, $C=\mu$, and $C_{,\alpha}=\mu_{,\alpha}=\mu_\alpha$ and the Fisher matrix (a single element) can be written in terms of the total number of photons and the number of spectral pixels. From (5), $F^O = N_{photons} + N_{pixels}/2$. The compressed data, on the other hand, have a Fisher matrix $F = N_{photons} + \frac{1}{2}$, so the error bar on the normalization is increased by a factor $$\text{Fractional error increase} \approx \sqrt{1 + \frac{1}{2s}} \tag{18}$$

for $N_{photons} \gg 1$, and $s \equiv N_{photons}/N_{pixels}$ is the average number of photons per pixel. Even if s is as low as 2, we see that the error bar is increased only by around 12%.

Computational Issues

We have reduced the likelihood problem in this case by a factor of more than a hundred. The eigenproblem is trivial to solve. The work to be done is in reducing a whole suite of model spectra to M numbers, and by forming scalar products of them with the vectors $b_m$. This is a one-shot task, and trivial in comparison with the job of generating the models.

Role of Fiducial Model

Figure 7A:
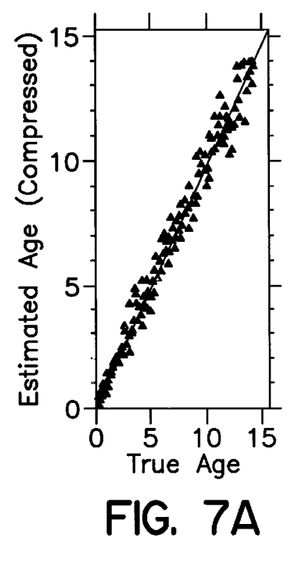
FIG. 7A is a graph of estimated age, compressed using the invention, against true age.
Figure 7B:
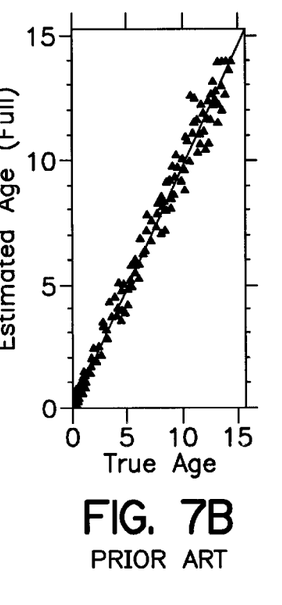
FIG. 7B is a graph of estimated age, provided from the full dataset, against true age.
Figure 7C:
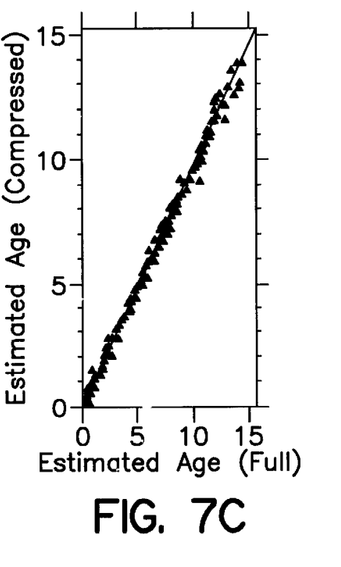
FIG. 7C is a graph of estimated age, compressed using the invention, against estimated age, provided from the full dataset.

The fiducial model sets the weightings $b_m$. After this step, the likelihood analysis is correct for each $y_m$, even if the fiducial model is wrong. The only place where there is an approximation is in the multiplication of the likelihoods from all $y_m$ to estimate finally the parameters. The $y_m$ are strictly only uncorrelated if the fiducial model coincides with the true model. This approximation can be dropped, if desired, by computing the correlations of the $y_m$ for each model tested. We have explored how the fiducial model affects the recovered parameters, and an example result from the two-parameter problem is shown in FIGS. 7A to 7C. Here the ages and normalizations of a set of 'true' galaxies with S/N<approx. 2 are estimated, using a common (9Gyr) galaxy as the fiducial model. Ages are recovered from many true galaxy spectra with ages between zero and 14 Gyr. FIG. 7A shows the recovered age from the two numbers $y_1$ and $y_2$ (with age and normalization weightings), plotted against the true model age. FIG. 7B shows how well the full dataset (with S/N<approx. 2) can recover the parameters. FIG. 7C shows the estimated age from the $y_1$ and $y_2$ plotted against the age recovered from the full dataset, showing that the compression adds very little to the error, even if the fiducial model is very wrong. Note also that the scatter increases with age; old galaxies are more difficult to date accurately. We see that the method is successful at recovering the age, even if the fiducial model is very badly wrong. There are errors, of course, but the important aspect is whether the compressed data do significantly worse than the full dataset of 352 numbers. FIG. 7C shows that this is not the case.

Although it appears from this example to be unnecessary, if one wants to improve the solution, then it is permissible to iterate, using the first estimate as the fiducial model. This adds to the computational task, but not significantly; assuming the first iteration gives a reasonable parameter estimate, then one does not have to explore the entire parameter space in subsequent iterations.

Comparison with Principal Component Analysis

It is interesting to compare the invention with other data compression and parameter estimation methods. For example, Principal Component Analysis (PCA) is another linear method (e.g. Murtagh F., Heck A. 1987 *Multivariate data analysis,* Astrophysics and Space Science Library, Reidel, Dordrecht; Francis P. et al, 1992 Astrophysical Journal 398, 476; Connolly A. et al, 1995 Astronomical Journal, 110, 1071; Folkes S. et al, 1996 Monthly Notices of the Royal Astronomical Society, 283, 651; Sodre H., Cuevas L., 1996 Monthly Notices of the Royal Astronomical Society, 287, 137; Galaz G., de Lapparent V., 1998 Astronomy & Astrophysics, 332, 459; Bromley B. et al, 1998 Astrophysical Journal 505, 25; Glazebrook K. et al, 1998 Astrophysical Journal 492, 88; Singh H et al, 1998 Monthly Notices of the Royal Astronomical Society, 295, 312; Connolly A., Szalay A. 1999 Astronomicial Journal, 117, 2052; Ronen R., et al, 1999 Monthly Notices of the Royal Astronomical Society, 303, 284; Folkes S. et al, 1999 Monthly Notices of the Royal Astronomical Society, 308, 459). This projects the data onto eigenvectors of the covariance matrix, which is determined empirically from the scatter between flux measurements of different galaxies. Part of the covariance matrix in PCA is therefore determined by differences in the models, whereas in our case C refers to the noise alone. PCA then finds uncorrelated projections which contribute in decreasing amounts to the variance between galaxies in the sample.

Figure 8:
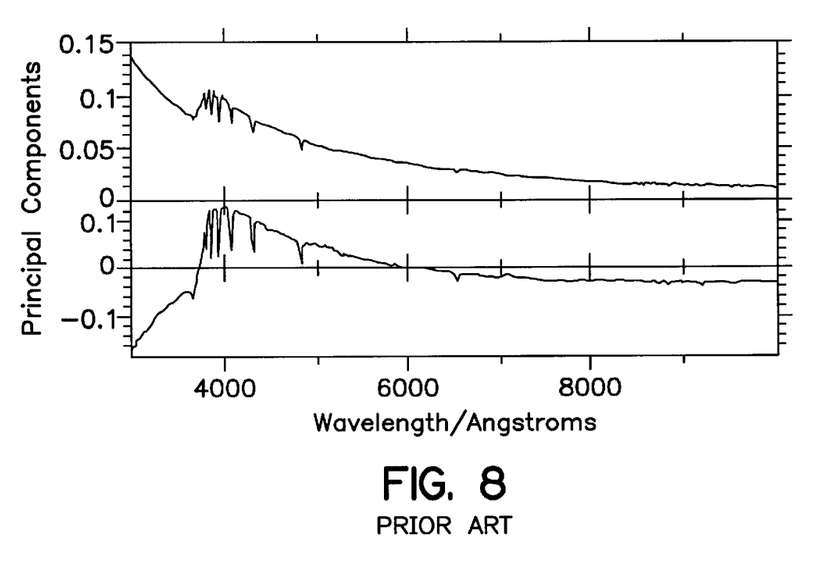
FIG. 8 shows the first two principal component eigenvectors, from a system of model spectra consisting of a burst at different times.
Figure 9:
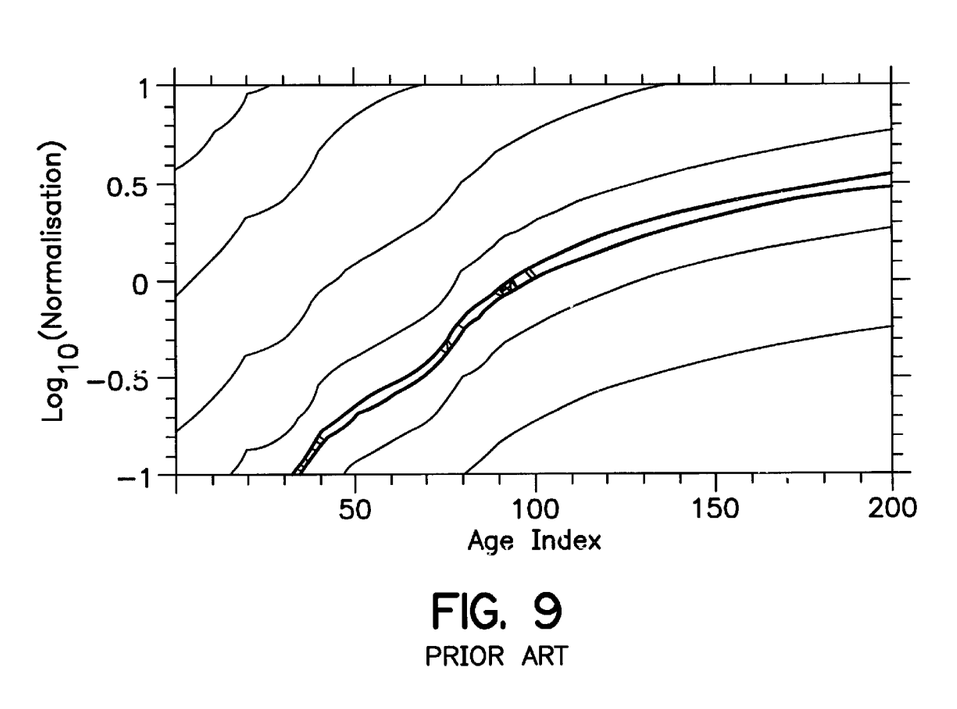
FIG. 9 is a contour plot of a likelihood solution from the first two principal components resulting from FIG. 8.
Figure 10:
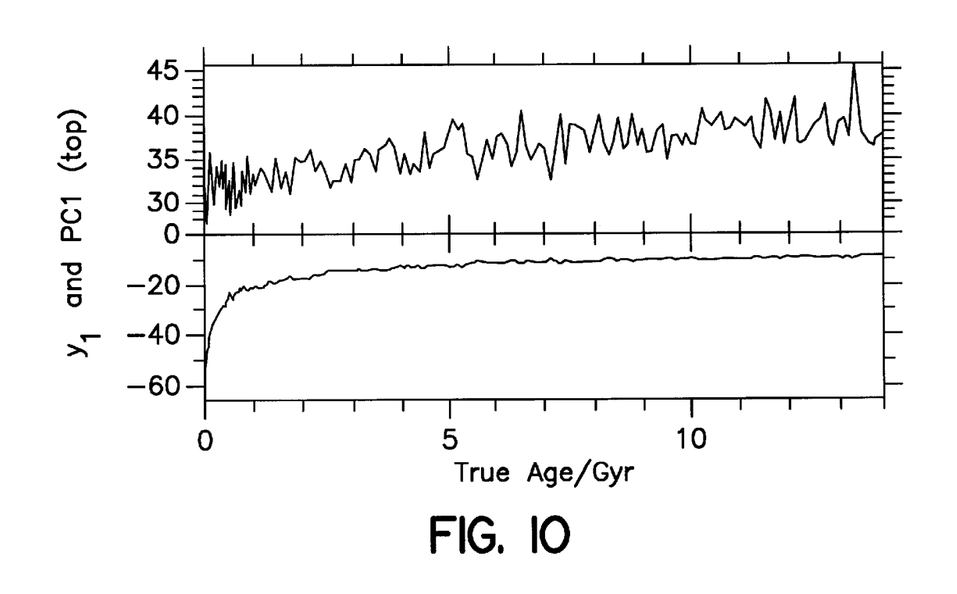
FIG. 10 is a graph comparing the first principal component with data calculated by the invention, both plotted against age.

One finds that the first principal component is correlated with the galaxy age (Ronen R., et al, 1999 Monthly Notices of the Royal Astronomical Society, 303, 284). FIG. 8 shows the PCA eigenvectors obtained from a set of 20 burst model galaxies which differ only in age, and FIG. 9 shows the resultant likelihood from the first two principal components. In the language of this disclosure, the principal components are correlated, so the 2×2 covariance matrix is used to determine the likelihood. We see that the components do not do nearly as well as the parameter eigenvectors; they do about as well as $y_1$ on its own. For interest, we plot the first principal component and $y_1$ vs. age in FIG. 10. One in every 10 models was used to do the PCA. In the presence of noise (S/N<2 per bin), $y_1$ is almost monotonic with age, whereas PC1, although correlated with age, is not a good age estimator. Since PCA is not optimized for parameter estimation, it is not lossless, and it should be no surprise that it fares less well than the tailored eigenfunctions of section III. However, if one cannot model the effect of the parameters a priori, then the method of the invention cannot be used, whereas PCA might still be an effective tool.

Discussion

We have presented a linear data compression algorithm for estimation of multiple parameters from an arbitrary dataset. If there are M parameters, the method reduces the data to a compressed dataset with M members. In the case where the noise is independent of the parameters, the compression is lossless; i.e. the M data contain as much information about the parameters as the entire dataset. Specifically, this means the mean likelihood surface around the peak is locally identical whichever of the full or compressed dataset is used as the data. It is worth emphasizing the power of this method: it is well known that, in the low-noise limit, the maximum likelihood parameter estimates are the best unbiased estimates. Hence if we do as well with the compressed dataset as with the full dataset, there is no other method, linear or otherwise, which can improve upon our results. The method can result in a massive compression, with the degree of compression given by the ratio of the size of the dataset to the number of parameters. Parameter estimation is speeded up by the same factor.

Although the method is lossless in certain circumstances, we believe that the data compression can still be very effective when the noise does depend on the model parameters. We have illustrated this using simulated galaxy spectra as the data, where the noise comes from photon counting (in practice, other sources of noise will also be present, and possibly dominant); we find that the algorithm is still almost lossless, with errors on the parameters increasing typically by a factor~$\sqrt{[1+1/(2s)]}$, where s is the average number of photons per spectral channel. The example we have chosen is a more severe test of the algorithm than real galaxy spectra; in reality the noise may well be dominated by factors external to the galaxy, such as detector read-out noise, sky background counts (for ground-based measurements) or zodiacal light counts (for space telescopes). In this case, the noise is indeed independent of the galaxy parameters, and the method is lossless.

The compression method requires prior choice of a fiducial model, which determines the projection vectors b. The choice of fiducial model will not bias the solution, and the likelihood given the $y_m$ individually can be computed without approximation. Combining the likelihoods by multiplication from the individual $y_m$ is approximate, as their independence is only guaranteed if the fiducial model is correct. However, in our examples, we find that the method correctly recovers the true solution, even if the fiducial model is very different. If one is cautious, one could always iterate. There are circumstances where the choice of a good fiducial model may be more important, if the eigenvectors depend very sensitively on the model parameters. An example of this is the determination of the redshift z of the galaxy, whose observed wavelengths are increased by a factor 1+z by the expansion of the Universe. If the main signal for z comes from spectral lines, then the method will give great weight to certain discrete wavelengths, determined by the fiducial z. If the true redshift is different, these wavelengths will not coincide with the spectral lines. It should be stressed that the method will still allow an estimate of the parameters, including z, but the error bars will not be optimal. This may be one case where applying the method iteratively may be of great value.

We have compared the parameter estimation method with another linear compression algorithm, Principal Component Analysis. PCA is not lossless unless all principal components are used, and compares unfavourably in this respect for parameter estimation. However, one requires a theoretical model for the methods of the invention; PCA does not require one, needing instead a representative ensemble for effective use. Other, more ad hoc, schemes consider particular features in the spectrum, such as broad-band colours, or equivalent widths of lines (Worthey G., 1994 Astrophysical Journal, Supplement, 95, 107). Each of these is a ratio of linear projections, with weightings given by the filter response or sharp filters concentrated at the line. There may well be merit in the way the weightings are constructed, but they will not in general do as well as the optimum weightings presented here. It is worth remarking on the ability of the method to separate parameters such as age and metallicity, which often appear degenerately in some methods. In the 'external noise' case, then provided the degeneracy can be lifted by maximum likelihood methods using every pixel in the spectrum, then it can also be lifted by using the reduced data. Of course, the modeling must be adequate to estimate the parameters using all the data. For example, a complication which may arise in a real galaxy spectrum is the presence of features not in the model, such as emission lines from hot gas. These can be included if the model is extended by inclusion of extra parameters. This problem exists whether the full or compressed data are used.

Of course, we can use standard goodness-of-fit tests to determine whether the data are consistent with the model as specified, or whether more parameters are required.

The data compression to a handful of numbers offers the possibility of a classification scheme for galaxy spectra. This is attractive as the numbers are connected closely with the physical processes which determine the spectrum. An additional realistic aim is to determine the star formation history of each individual galaxy, without making specific assumptions about the form of the star formation rate. The method of the invention provides the means to achieve this.

Whilst the invention has been illustrated above with respect to galaxy spectra, it is applicable to other fields in which parameters are required to be estimated from a noisy dataset, and a reasonable underlying model for the data is available. Such fields include, without limitation, oil exploration, medical imaging, speech recognition, analysis of musical data and military sensing.

Appendix

In this appendix, we prove that the linear compression algorithm for estimation of an arbitrary number M of parameters is lossless, provided the noise is independent of the parameters, $C_{,\alpha}=0$. Specifically, loss-free means the Fisher matrix for the set of M numbers $y_m=b^t_m x$ is identical to the Fisher matrix of the original dataset x:

$$F_{\alpha\beta}^O = \langle \alpha/\beta \rangle. \tag{19}$$

By construction, the $y_m$ are uncorrelated, so the likelihoods multiply and the Fisher matrix for the set $\{y_m\}$ is the sum of the derivatives of the log-likelihoods from the individual $y_m$:

$$F_{\alpha\beta} = \sum_m F_{\alpha\beta}(m). \tag{20}$$

From (7), $$F_{\alpha\beta}(m) = (b_m^t \mu_{,\alpha})(b_m^t \mu_{,\beta}) \tag{21}$$

With (14), we can write $$b_m^t = \frac{\mu_{,m}^t C^{-1} - \sum_{q=1}^{m-1}(b_q^t \mu_{,m}^t)b_q}{\sqrt{\langle m|m\rangle - \sum_{q=1}^{m-1}(b_q^t \mu_{,m}^t)^2}}. \tag{22}$$

Hence $$F_{\alpha\beta}(m) = \left[\langle \alpha|m\rangle - \sum_{q=1}^{m-1} F_{\alpha m}(q)\right] \times \frac{\left[\langle \beta|m\rangle - \sum_{q=1}^{m-1} F_{\beta m}(q)\right]}{\left[\langle m|m\rangle - \sum_{q=1}^{m-1} F_{mn}(q)\right]} \tag{23}$$

Consider first $\beta=m$:

$$F_{\alpha m}(m) = \langle \alpha|m\rangle - \sum_{q=1}^{m-1} F_{\alpha m}(q) \tag{24}$$

$$\Rightarrow F_{\alpha M} = \sum_{q=1}^{M} F_{\alpha M}(q) = \langle \alpha|M\rangle = F_{\alpha M}^O$$

proving that these terms are unchanged after compression. We therefore need to consider $F_{\alpha\beta}(m)$ for $\alpha$ or $\beta<m$. First we note that $$F_{\alpha\beta}(m) = \frac{F_{\alpha m}(m) F_{m\beta}(m)}{F_{mm}(m)} \qquad (25)$$

and, from (24)

$$\sum_{q=1}^{\beta} F_{\alpha\beta}(q) = \langle \alpha | \beta \rangle \qquad (26)$$

We want the sum to extend to M. However, the terms from $\beta+1$ to M are all zero. This can be shown as follows: (25) shows that it is sufficient to show that $F_{\alpha m}(m)=0$ if $m > \alpha$. Setting $\beta = m$ in (26), and reversing $\alpha$ and $m$, we get $$\sum_{\alpha+1}^{m} F_{\alpha m}(q) = 0. \qquad (27)$$

Now, the contribution from q does not depend on derivatives with respect to higher-numbered parameters, so we can evaluate $F_{\alpha m}(\alpha+1)$ by setting $m = \alpha+1$. The sum (27) implies that this term is zero. Increasing m successively by one up to M, and using (27), proves that all the terms are zero, proving that the compression is lossless.

We claim:

1. A method of compressing a dataset which is dependent on a plurality of parameters, as well as on noise, comprising forming a plurality of sets of weights, one set for each parameter, from an initial guess for the parameters, multiplying all the data in the dataset by each set of weights in turn and summing the products in each case to give compressed data for estimating the parameters, the number of compressed data being equal to the number of parameters.

2. The method according to claim 1, wherein the dataset comprises N elements of data, and wherein the N elements of data are represented by a vector $x_i$, i=1, . . . N, x comprising a signal part $\mu$ and noise n.

3. The method according to claim 2, wherein the plurality of parameters comprises M parameters, and wherein for estimating the M parameters, the sets of weights consists of M vectors $b_m$, m=1, . . . M.

4. The method according to claim 3, wherein for m=1

$$b_1 = \frac{C^{-1}\mu_{,1}}{\sqrt{\mu_{,1}^t C^{-1} \mu_{,1}}}$$

and for m>1

$$b_m = \frac{C^{-1}\mu_{,m} - \sum_{q=1}^{m-1} (\mu_{,m}^t b_q) b_q}{\sqrt{\mu_{,m} C^{-1} \mu_{,m} - \sum_{q=1}^{m-1} (\mu_{,m}^t b_q)^2}}.$$

where C is the noise covariance matrix computed from the initial guess.

5. The method according to claim 1, comprising a further step of estimating the parameters from the compressed data using the method of maximum likelihood.

6. The method according to claim 1, wherein the parameters are estimated from the compressed data and used as a new initial guess, and the steps of forming the sets of weights, multiplying the dataset by the sets of weights and summing the products are repeated using the new initial guess.

7. The method according to claim 6, comprising further iterations of forming sets of weights, multiplying the dataset by the sets of weights and summing the products.

* * * * *